(12) United States Patent
Cheng et al.

(10) Patent No.: US 11,410,882 B2
(45) Date of Patent: *Aug. 9, 2022

(54) METHOD OF FORMING SEMICONDUCTOR DEVICE HAVING A DUAL MATERIAL REDISTRIBUTION LINE AND SEMICONDUCTOR DEVICE

(71) Applicant: TAIWAN SEMICONDUCTOR MANUFACTURING COMPANY, LTD., Hsinchu (TW)

(72) Inventors: Anhao Cheng, Hsinchu (TW); Chun-Chang Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 3 days.

This patent is subject to a terminal disclaimer.

(21) Appl. No.: 17/063,012

(22) Filed: Oct. 5, 2020

(65) Prior Publication Data
US 2021/0020506 A1 Jan. 21, 2021

Related U.S. Application Data

(60) Continuation of application No. 15/997,429, filed on Jun. 4, 2018, now Pat. No. 10,811,314, which is a
(Continued)

(51) Int. Cl.
*H01L 21/768* (2006.01)
*H01L 23/48* (2006.01)
(Continued)

(52) U.S. Cl.
CPC ...... *H01L 21/76877* (2013.01); *H01L 21/304* (2013.01); *H01L 21/76802* (2013.01); *H01L 21/76804* (2013.01); *H01L 21/76807* (2013.01); *H01L 21/76852* (2013.01); *H01L 21/76873* (2013.01); *H01L 23/481* (2013.01); *H01L 23/525* (2013.01); *H01L 23/5226* (2013.01);
(Continued)

(58) Field of Classification Search
CPC ..... H01L 23/481; H01L 23/525; H01L 24/11; H01L 24/02; H01L 23/5226; H01L 24/32; H01L 24/29; H01L 24/20; H01L 24/19; H01L 24/03; H01L 21/76877; H01L 21/76804; H01L 21/76802; H01L 21/76807; H01L 21/76852; H01L 21/76873; H01L 21/304
See application file for complete search history.

(56) References Cited

U.S. PATENT DOCUMENTS 6,191,031 B1 2/2001 Taguchi et al.
6,656,828 B1 12/2003 Maitani et al.
(Continued)

*Primary Examiner* — Shouxiang Hu
(74) *Attorney, Agent, or Firm* — Hauptman Ham, LLP

(57) ABSTRACT

A method of making a semiconductor device includes depositing a second conductive material over a first conductive material, wherein the second conductive material is different from the first conductive material, and the second conductive material defines a redistribution line (RDL). The method further includes depositing a passivation layer over the RDL, wherein depositing the passivation layer comprises forming a plurality of convex sidewalls, and each of the plurality of convex sidewalls extends beyond an edge of the RDL.

20 Claims, 7 Drawing Sheets

Related U.S. Application Data division of application No. 15/223,492, filed on Jul. 29, 2016, now Pat. No. 9,991,189.

(51) Int. Cl.
  *H01L 23/00* (2006.01)
  *H01L 23/522* (2006.01)
  *H01L 23/525* (2006.01)
  *H01L 21/304* (2006.01)

(52) U.S. Cl.
  CPC .............. *H01L 24/02* (2013.01); *H01L 24/11* (2013.01); *H01L 24/20* (2013.01); *H01L 24/29* (2013.01); *H01L 24/32* (2013.01); *H01L 24/05* (2013.01); *H01L 24/13* (2013.01); *H01L 2224/0231* (2013.01); *H01L 2224/0233* (2013.01); *H01L 2224/0235* (2013.01); *H01L 2224/0239* (2013.01); *H01L 2224/02166* (2013.01); *H01L 2224/02311* (2013.01); *H01L 2224/02313* (2013.01); *H01L 2224/02331* (2013.01); *H01L 2224/0345* (2013.01); *H01L 2224/03452* (2013.01); *H01L 2224/03462* (2013.01); *H01L 2224/0401* (2013.01); *H01L 2224/05008* (2013.01); *H01L 2224/05022* (2013.01); *H01L 2224/05124* (2013.01); *H01L 2224/05144* (2013.01); *H01L 2224/05166* (2013.01); *H01L 2224/05181* (2013.01); *H01L 2224/05184* (2013.01); *H01L 2224/05186* (2013.01); *H01L 2224/05571* (2013.01); *H01L 2224/05624* (2013.01); *H01L 2224/05639* (2013.01); *H01L 2224/05644* (2013.01); *H01L 2224/05647* (2013.01); *H01L 2224/131* (2013.01); *H01L 2224/13022* (2013.01); *H01L 2224/13024* (2013.01); *H01L 2224/13082* (2013.01); *H01L 2224/13147* (2013.01); *H01L 2924/01013* (2013.01); *H01L 2924/01029* (2013.01)

(56) References Cited

U.S. PATENT DOCUMENTS

| | | | |
|---|---|---|---|
| 7,652,378 | B2 | 1/2010 | Tseng et al. |
| 7,791,196 | B2 | 9/2010 | Ishino et al. |
| 8,836,146 | B2 * | 9/2014 | Chou .................... H01L 24/11 |
| | | | 257/E23.021 |
| 10,811,314 | B2 * | 10/2020 | Cheng ............... H01L 21/76807 |
| 2002/0164840 | A1 | 11/2002 | Lu et al. |
| 2012/0043654 | A1 * | 2/2012 | Lu .......................... H01L 24/11 |
| | | | 257/737 |
| 2012/0326336 | A1 | 12/2012 | Chou et al. |
| 2013/0307143 | A1 | 11/2013 | Lin et al. |
| 2014/0191392 | A1 | 7/2014 | Tu et al. |

* cited by examiner

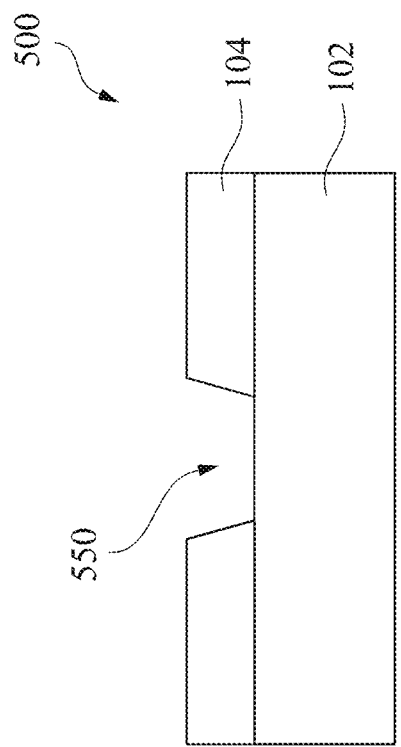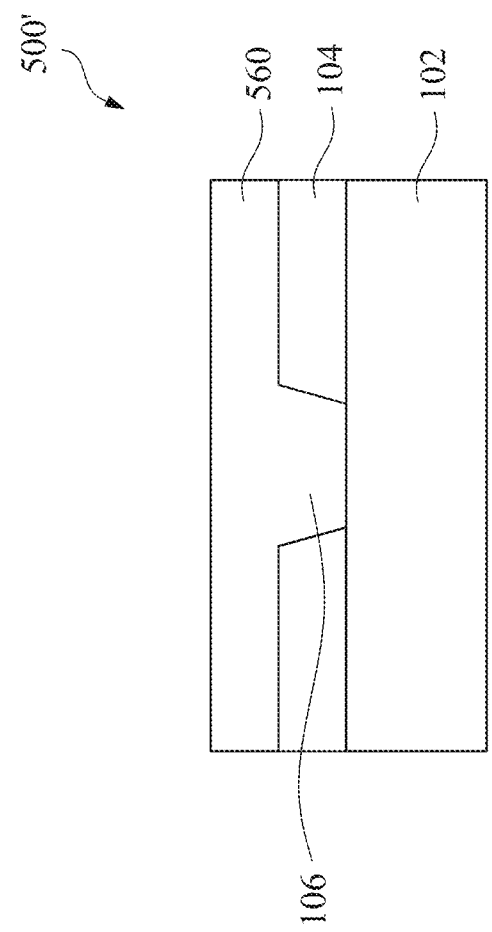

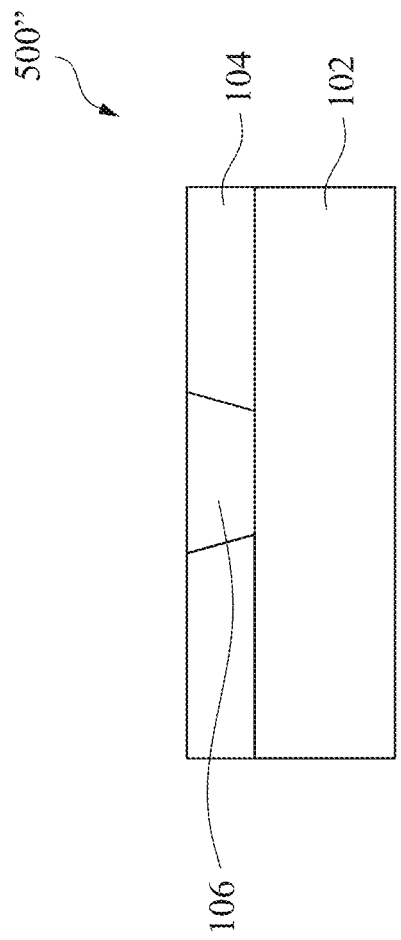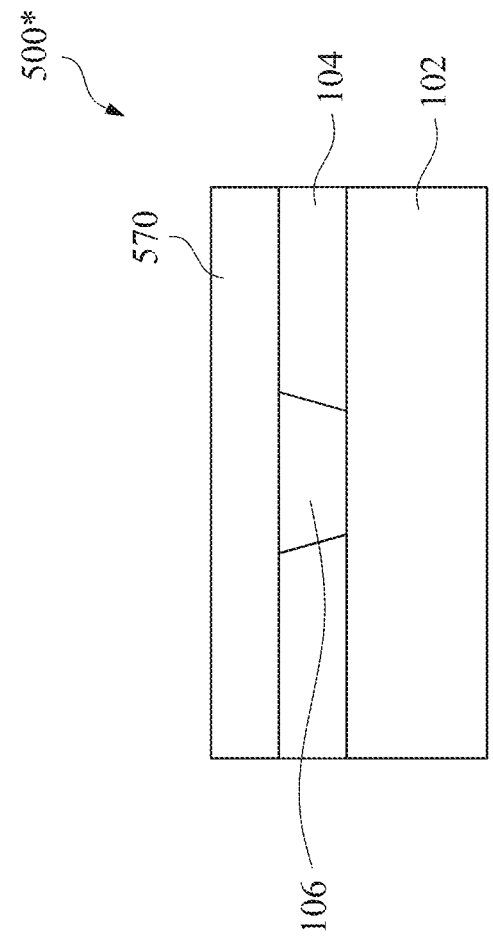

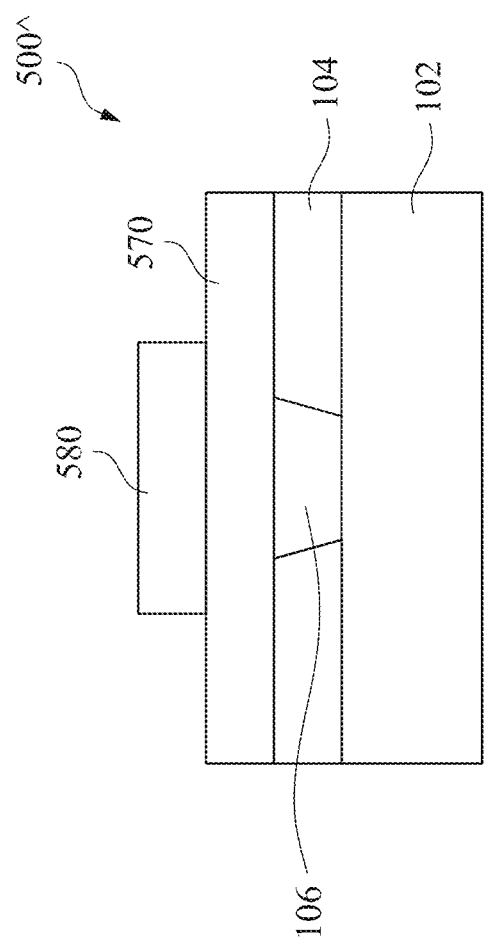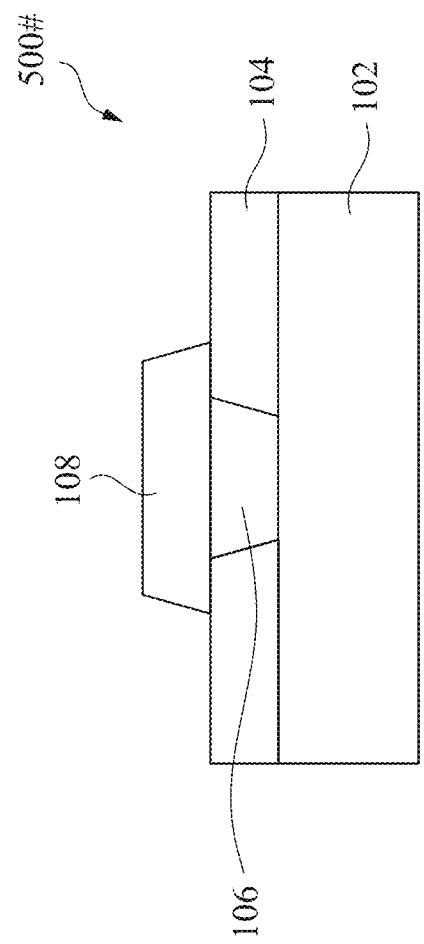

METHOD OF FORMING SEMICONDUCTOR DEVICE HAVING A DUAL MATERIAL REDISTRIBUTION LINE AND SEMICONDUCTOR DEVICE

PRIORITY CLAIM

The present application is a continuation of U.S. application Ser. No. 15/997,429, filed Jun. 4, 2018, which is a divisional of U.S. application Ser. No. 15/223,492, filed Jul. 29, 2016, now U.S. Pat. No. 9,991,189, issued Jun. 5, 2018, which are incorporated herein by reference in their entireties.

BACKGROUND

A semiconductor die is connectable to other devices external to the semiconductor die through different types of packaging including wire bonding or flip chip packaging. The semiconductor die includes metallization layers comprising metal layers, dielectric layers, metal vias, re-distribution layers, and post-passivation interconnects, in some instances. Wire bonding connects integrated circuits (ICs) to substrates directly via the wiring, while the flip chip packaging (or wafer-level chip scale package (WLCSP)) solder bumps or pillars are formed by initially forming a layer of underbump metallization on the semiconductor die and then placing the solder bump or pillar onto the underbump metallization. A reflow operation is performed in order to bond the solder bump or pillar with the external device.

A redistribution layer (RDL) is used to adjust a location of the solder bump or pillar with respect to a top metal layer of the semiconductor die. The RDL is used to fan-out connections to the external device and to reduce the stress on the top metal layer of the semiconductor die during a bonding process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5F are cross-sectional views of a semiconductor device during various stages of production according to some embodiments.

DETAILED DESCRIPTION

Figure 1:
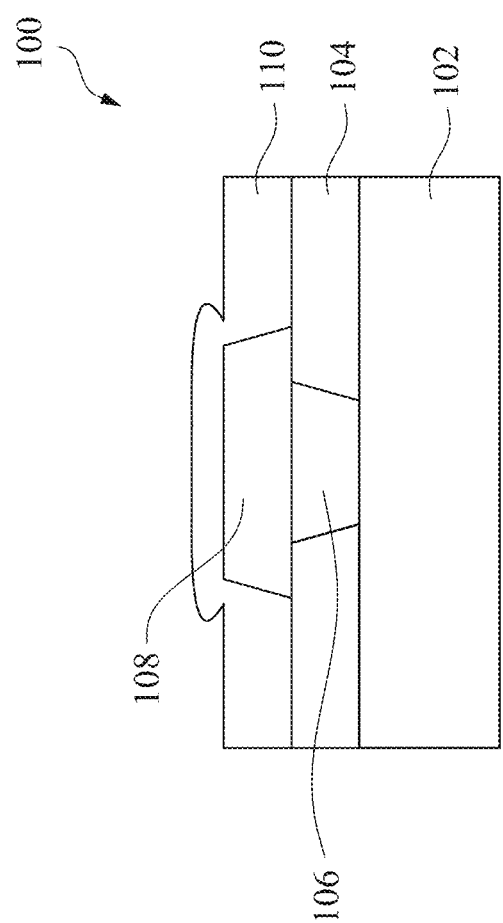
FIG. 1 is a cross-sectional view of a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A redistribution layer (RDL) is used to connect a semiconductor device to an external device. In some instances, the RDL is formed directly on a top metal layer of an interconnect structure of the semiconductor device. A passivation layer separates a portion of the RDL from a dielectric material of the interconnect structure of the semiconductor device and the RDL is electrically connected to the top metal layer of the interconnect structure by an RDL via. Forming the RDL and RDL via in a single formation process, such as by sputtering deposition of aluminum, often results in a recess in the RDL at a location above the RDL via. As a result of the recess in the RDL, a second passivation layer over the RDL often has a void above the RDL via. The void in the passivation layer increases a risk of oxidation of the RDL. For example, in some instances, liquids from later processes flow into the void and damage the RDL, such as by causing pin holes in the RDL. The pin holes increase the resistance of the RDL and negatively impact the ability of the RDL to transfer a signal from the semiconductor device to the external device.

The current description uses a multi-step process for forming an RDL and an RDL via. This multi-step process helps to avoid recesses in the RDL at the location of the RDL via and consequently also reduces the risk of voids in a passivation layer over the RDL. The passivation layer over the RDL has a flat surface over the RDL, which helps to reduce errors in a manufacturing process for the semiconductor device.

FIG. 1 is a cross-sectional view of a semiconductor device 100 in accordance with some embodiments. Semiconductor device 100 includes a top metal layer 102. The top metal layer 102 is a top-most layer of an interconnect structure of semiconductor device 100. A first passivation layer 104 is over the top metal layer 102. An RDL via 106 is located in an opening in the first passivation layer 104. RDL via 106 is electrically connected to top metal layer 102. An RDL 108 is over RDL via 106 and extends over a top surface of first passivation layer 104. RDL 108 is electrically connected to top metal layer 102 through RDL via 106. RDL 108 has a substantially flat top surface along an entirety of RDL 108. Substantially flat means that the surface is flat with the exception of unavoidable surface roughness resulting from a manufacturing process for forming RDL 108. A second passivation layer 110 is over RDL 108. Second passivation layer 110 contacts first passivation layer 104 beyond a periphery of RDL 108. An entirety of second passivation layer 110 over RDL 108 has a substantially flat top surface.

In some embodiments, semiconductor device 100 includes active devices, such as transistors. In some embodiments, semiconductor device 100 includes passive devices, such as resistors or capacitors. In some embodiments, semiconductor device 100 is an interposer. The interconnect structure of semiconductor device 100 is used to connect various elements of semiconductor device 100 together in order to route a signal from one element to another.

Top metal layer 102 electrically connects RDL 108 to other elements of semiconductor device 100 through the interconnect structure. In some embodiments, top metal layer 102 includes copper or a copper alloy. In some embodiments, top metal layer 102 includes a material other than copper, such as aluminum, tungsten, gold or another suitable material. In some embodiments, top metal layer 102 is formed using a damascene process, such as a dual damascene process. In some embodiments, top metal layer 102 is formed by electroplating, physical vapor deposition (PVD), sputtering, chemical vapor deposition (CVD) or another suitable formation process. Top metal layer 102 is located within a dielectric material of the interconnect structure.

First passivation layer 104 extends over top metal layer 102 and helps to prevent oxidation of top metal layer 102. In some embodiments, first passivation layer 104 includes silicon oxide, silicon nitride, polyimide, undoped silicate glass (USG), fluorinated silicate glass (FSG) or another suitable material. In some embodiments, first passivation layer 104 is a same material as the dielectric material of the interconnect structure. In some embodiments, first passivation layer 104 is a different material from the dielectric material of the interconnect structure. In some embodiments, first passivation layer is formed by spin-on coating, PVD, sputtering, CVD or another suitable formation process. In some embodiments, a thickness of first passivation layer 104 ranges from about 200 nanometers (nm) to about 1800 nm. In some embodiments, the thickness of first passivation layer 104 ranges from 400 nm to about 1200 nm. If the thickness of first passivation layer 104 is too large, an aspect ratio of the opening for forming RDL via 106 increases and becomes more difficult to fill, in some instances. If the thickness of first passivation layer 104 is too small, first passivation layer 104 does not adequately protect top metal layer 102 from oxidation, in some instances.

In some embodiments, a first etch stop layer (not shown) is located between first passivation layer 104 and top metal layer 102. The first etch stop layer has a different material from first passivation layer 104 to provide a different etch selectivity from first passivation layer 104. In some embodiments, the first etch stop layer includes silicon oxide, silicon nitride, silicon oxynitride, silicon carbide or another suitable material. RDL via 106 connects to top metal layer 102 through an opening in the first etch stop layer which is aligned with the opening in first passivation layer 104. In some embodiments, the first etch stop layer is formed using sputtering, PVD, CVD or another suitable formation process. In some embodiments, a thickness of the first etch stop layer ranges from about 10 nm to about 150 nm. In some embodiments, the thickness of the first etch stop layer ranges from about 35 nm to about 120 nm. If a thickness of the first etch stop layer is too large, then an aspect ratio of the opening for forming RDL via 106 is too large or a size of semiconductor device 100 is needlessly increased, in some instances. If the thickness of the first etch stop layer is too small, etch stop layer will not be capable of protecting top metal layer 102 during an etching process performed on first passivation layer 104, in some instances.

RDL via 106 fills the opening in first passivation layer 104 and electrically connects to top metal layer 102. A top surface of RDL via 106 is substantially coplanar with the top surface of first passivation layer 104. The coplanar relationship between the top surface of RDL via 106 and the top surface of first passivation layer 104 helps to avoid recesses in RDL 108 in comparison with other approaches. In some embodiments, RDL via 106 includes copper or a copper alloy. In some embodiments, RDL via 106 includes tungsten, gold or another suitable material. In some embodiments, RDL via 106 is a same material as top metal layer 102. In some embodiments, RDL via 106 is a different material from top metal layer 102. In some embodiments, RDL via 106 is formed by electroplating. In some embodiments, RDL via 106 is formed by sputtering, PVD, CVD or another suitable formation process.

In some embodiments which include an etch stop layer, a thickness of RDL via 106 is greater than the thickness of first passivation layer 104. In some embodiments, the thickness of RDL via 106 is equal to the thickness of first passivation layer 104. In some embodiments, the thickness of RDL via 106 ranges from about 200 nm to about 1800 nm. In some embodiments, the thickness of RDL via 106 ranges from about 400 nm to about 1200 nm. If the thickness of RDL via 106 is too large, a size of semiconductor device 100 is needlessly increased and a delay for a signal traveling along RDL via 106 is increased due to the increased thickness of RDL via 106, in some instances. If the thickness of RDL via 106 is too small, then the top surface of RDL via 106 is not coplanar with the top surface of first passivation layer 104 or the thickness of first passivation layer 104 is too small to prevent oxidation of top metal layer 102, in some instances.

RDL 108 extends over first passivation layer 104 and electrically connects to RDL via 106. A bottom surface of RDL 108 is substantially flat because the top surface of RDL via 106 and the top surface of first passivation layer 104 are coplanar. In addition, a top surface of RDL 108 is substantially flat. The lack of a recess in the top surface of RDL 108 helps to prevent voids in second passivation layer 110 and the resulting pinhole oxidation of RDL 108. RDL 108 extends beyond RDL via 106 on both sides of RDL via 106. In some embodiments, RDL 108 includes an edge aligned with an edge of RDL via 106 and extends beyond RDL via 106 in only a single direction.

A material of RDL 108 is different from a material of RDL via 106. In some embodiments, RDL 108 includes aluminum. In some embodiments, RDL 108 includes tungsten, gold or another suitable material. In some embodiments, the material of RDL 108 is a same material as top metal layer 102. In some embodiments, RDL 108 is a different material from top metal layer 102. A process for forming RDL 108 is different from a process for forming RDL via 106. In some embodiments, RDL 108 is formed using sputtering. In some embodiments, RDL 108 is formed using PVD, CVD or another suitable formation process.

In some embodiments, a thickness of RDL 108 ranges from about 700 nm to about 4200 nm. In some embodiments, the thickness of RDL 108 ranges from about 1000 nm to about 3600 nm. If the thickness of RDL 108 is too small, a resistance of RDL 108 is increased and signal integrity is decreased, in some instances. If the thickness of RDL 108 is too large, a size of semiconductor device 100 is needlessly increased, in some instances.

Second passivation layer 110 extends over RDL 108 and over first passivation layer 104. Second passivation layer 110 helps to prevent oxidation of RDL 108. A top surface of second passivation layer 110 over RDL 108 is substantially flat. The substantially flat top surface of second passivation layer 110 omits voids that occur in other devices which lead to pinhole oxidation of RDL 108. Omitting voids in second passivation layer 110 improves the reliability of semiconductor device 100 in comparison with other semiconductor devices.

In some embodiments, second passivation layer 110 includes silicon oxide, silicon nitride, polyimide, undoped silicate glass (USG), fluorinated silicate glass (FSG) or another suitable material. In some embodiments, second passivation layer 110 is a same material as the dielectric material of the interconnect structure. In some embodiments, second passivation layer 110 is a different material from the dielectric material of the interconnect structure. In some embodiments, second passivation layer 110 is a same material as first passivation layer 104. In some embodiments, second passivation layer 110 is a different material from first passivation layer 104. In some embodiments, second passivation layer 110 is formed by spin-on coating, PVD, sputtering, CVD or another suitable formation process. In some embodiments, second passivation layer 110 is formed using a same process as first passivation layer 104. In some embodiments, second passivation layer 110 is using a different process from first passivation layer 104.

In some embodiments, a thickness of second passivation layer 110 ranges from about 200 nm to about 2000 nm. In some embodiments, the thickness of second passivation layer 110 ranges from 400 nm to about 1600 nm. If the thickness of second passivation layer 110 is too large, an aspect ratio of an opening to expose RDL 108 increases and becomes more difficult to fill, in some instances. If the thickness of second passivation layer 110 is too small, second passivation layer 110 does not adequately protect RDL 108 from oxidation, in some instances. In some embodiments, second passivation layer 110 has a same thickness as first passivation layer 104. In some embodiments, second passivation layer 110 has a different thickness from first passivation layer 104.

In some embodiments, a second etch stop layer is over second passivation layer 110. The second etch stop layer has a different material from second passivation layer 110, to provide a different etch selectivity from second passivation layer 110. In some embodiments, the second etch stop layer includes silicon oxide, silicon nitride, silicon oxynitride, silicon carbide or another suitable material. In some embodiments, a material of the second etch stop layer is a same material as the first etch stop layer. In some embodiments, the material of the second etch stop layer is different from the material of the first etch stop layer.

A bump structure connects to RDL 108 through an opening in the second etch stop layer which is aligned with an opening in second passivation layer 110. In some embodiments, the second etch stop layer is formed using sputtering, PVD, CVD or another suitable formation process. In some embodiments, a thickness of the second etch stop layer ranges from about 200 nm to about 2000 nm. In some embodiments, the thickness of the second etch stop layer ranges from about 300 nm to about 1200 nm. If a thickness of the second etch stop layer is too large, then an aspect ratio of the opening for exposing a portion of RDL 108 is too large or a size of semiconductor device 100 is needlessly increased, in some instances. If the thickness of the second etch stop layer is too small, second etch stop layer will not be capable of protecting second passivation layer 110 during an etching process, in some instances. In some embodiments, the thickness of the second etch stop layer is a same thickness as the first etch stop layer. In some embodiments, the thickness of the second etch stop layer is different from the thickness of the first etch stop layer.

By using separate formation processes for RDL via 106 and RDL 108, semiconductor device 100 is able to avoid a recess in a top surface of RDL 108 over RDL via 106 and the resulting void in second passivation layer 110. As a result, semiconductor device 100 is more resistant to pinhole oxidation of RDL 108 in comparison with other devices which have a recess in a top surface of RDL 108 and/or a void in second passivation layer 110.

Figure 2B:
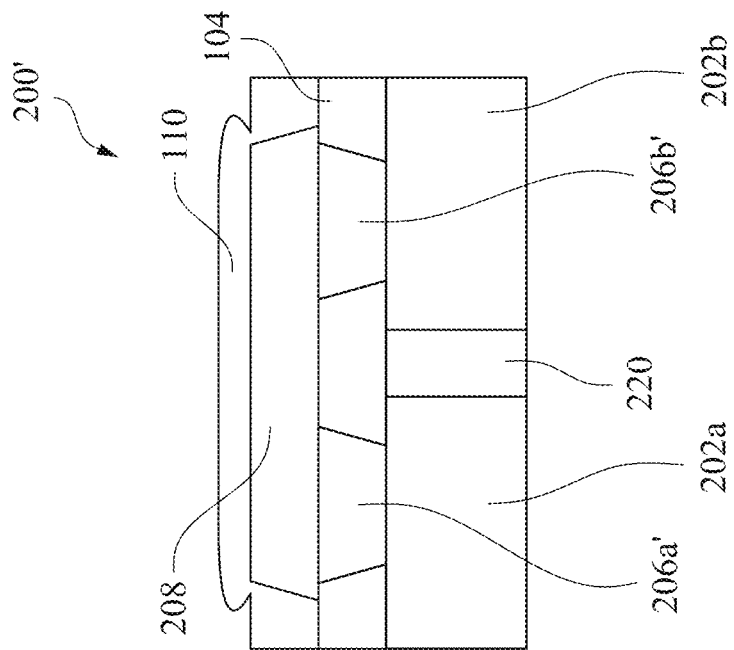
FIG. 2B is a cross-sectional view of a semiconductor device according to some embodiments.
Figure 2A:
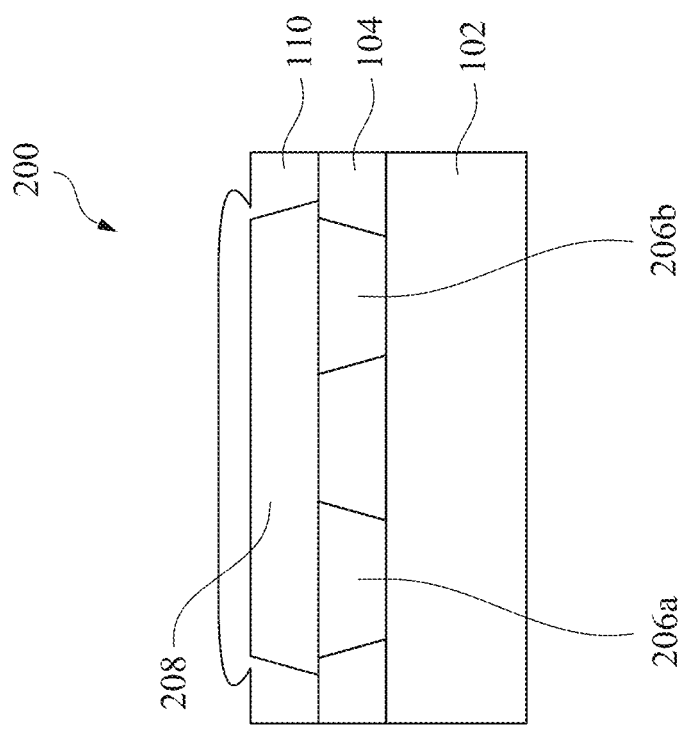
FIG. 2A is a cross-sectional view of a semiconductor device according to some embodiments.

FIG. 2A is a cross-sectional view of a semiconductor device 200 in accordance with some embodiments. Semiconductor device 200 includes some of the same elements as semiconductor device 100; and the same elements have a same reference number. In comparison with semiconductor device 100, semiconductor device 200 includes an RDL 208 extending across two RDL vias 206a and 206b. RDL vias 206a and 206b are connected to a same top metal layer 102. Semiconductor device 200 includes two RDL vias 206a and 206b; however, in some embodiments, semiconductor device 200 includes more than two RDL vias.

Including multiple RDL vias 206a and 206b helps to reduce resistance between RDL vias 206a and 206b and RDL 208 in comparison with the structure of semiconductor device 100. A top surface of both RDL vias 206a and 206b is substantially coplanar with the top surface of first passivation layer 104. RDL vias 206a and 206b have a same width. In some embodiments, a width of RDL via 206a is different from a width of RDL via 206b. RDL 208 extends beyond both RDL vias 206a and 206b in both directions. In some embodiments, RDL 208 includes an edge aligned with an edge of RDL via 206a or RDL via 206b. In some embodiments, RDL 208 includes a first edge aligned with an edge of RDL via 206a and a second edge aligned with an edge of RDL via 206b.

FIG. 2B is a cross-sectional view of a semiconductor device 200' in accordance with some embodiments. Semiconductor device 200' includes some of the same elements as semiconductor device 100; and the same elements have a same reference number. In comparison with semiconductor device 200, semiconductor device 200' includes a dielectric material 220 of an interconnect structure between top metal layer 202a and top metal layer 202b. RDL via 206a' is electrically connected to top metal layer 202a; and RDL via 206b' is electrically connected to top metal layer 202b. In some embodiments, semiconductor device 200' includes multiple RDL vias connected to at least one of top metal layer 202a or top metal layer 202b.

Dielectric material 220 insulates top metal layer 202a from top metal layer 202b. Including dielectric material 220 helps semiconductor device 200' to connect separate components to RDL 208. For example, a first active device is electrically connected to RDL 208 through top metal layer 202a; while a second active device, separate from the first active device, is electrically connected to RDL 208 through top metal layer 202b. In some embodiments, dielectric material 220 includes silicon oxide, silicon nitride, silicon oxynitride, silicon carbide or another suitable dielectric material. In some embodiments, a material of dielectric material 220 is a same material as at least one of first passivation layer 104 or second passivation layer 110. In some embodiments, the material of dielectric material 220 is different from both first passivation layer 104 and second passivation layer 110.

Figure 3:
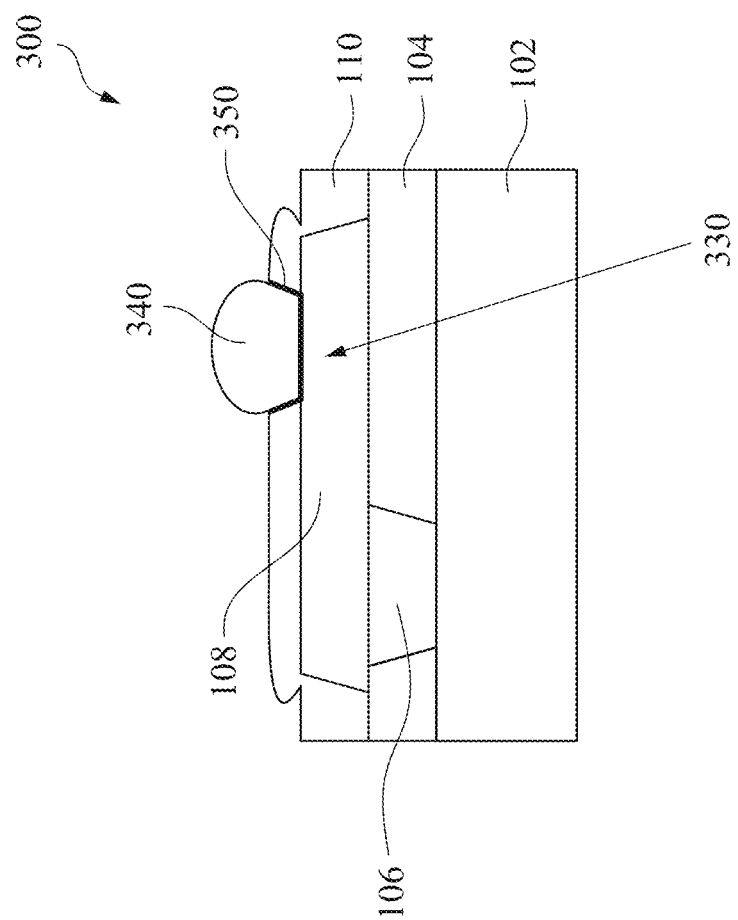
FIG. 3 is a cross-sectional view of a semiconductor device according to some embodiments.

FIG. 3 is a cross-sectional view of a semiconductor device 300 in accordance with some embodiments. Semiconductor device 300 includes some of the same elements as semiconductor device 100; and same elements have a same reference number. In comparison with semiconductor device 100, semiconductor device 300 includes a landing region 330 on RDL 108; and a bump structure 340 and an under bump metallurgy (UBM) layer 350 for connecting RDL 108 to the external device. Landing region 330 is spaced away from RDL via 106 so that none of landing region 330 overlaps RDL via 106.

Landing region 330 is a portion of RDL 108 exposed by an opening in second passivation layer 110. In some embodiments, the opening in second passivation layer 110 is formed by etching second passivation layer 110. In some embodiments, a photoresist is deposited over second passivation layer 110. The photoresist is then patterned to define a location of the opening in second passivation layer 110 for forming landing region 330. Semiconductor device 300 includes a single landing region 330. In some embodiments, semiconductor device 300 includes multiple landing regions. In some embodiments, a first landing region is located on a first side of RDL via 106 and a second landing region is located on a second side of RDL via 106 opposite the first side.

Bump structure 340 is a solder bump. In some embodiments, bump structure includes a copper pillar. Bump structure is used to electrically connect semiconductor device 300 to the external device using a reflow process. Semiconductor device 300 includes a single bump structure 340. In some embodiments, semiconductor device 300 includes multiple bump structures in a same landing region 330.

UBM layer 350 is used to improve adhesion between bump structure 340 and RDL 108, and to prevent diffusion of materials of bump structure 340 into RDL 108. In some embodiments, UBM layer 350 includes multiple layers. In some embodiments, UBM layer 350 includes a diffusion barrier layer and a seed layer. In some embodiments, the seed layer comprises copper, copper alloys, silver, gold, aluminum or another suitable material. In some embodiments, a thickness of the seed layer ranges from about 100 nm to about 1000 nm. If the thickness of the seed layer is too large, a size of semiconductor device 300 is needlessly increased, in some instances. If the thickness of seed layer is too small, the seed layer does not provide sufficient adhesion between bump structure 340 and RDL 108, in some instances. In some embodiments, the diffusion barrier layer includes titanium, titanium nitride, tantalum, tantalum nitride or another suitable material. In some embodiments, a thickness of the diffusion barrier layer ranges from about 50 nm to about 200 nm. If the thickness of the diffusion barrier layer is too large, a size of semiconductor device 300 is needlessly increased, in some instances. If the thickness of diffusion barrier layer is too small, the diffusion barrier layer does not provide a sufficient barrier to prevent diffusion of material from bump structure 340 to RDL 108, in some instances.

In some embodiments, UBM layer 350 extends along a top surface of second passivation layer 110. In some embodiments, UBM layer 350 exposes an entire surface of second passivation layer 110.

Figure 4:
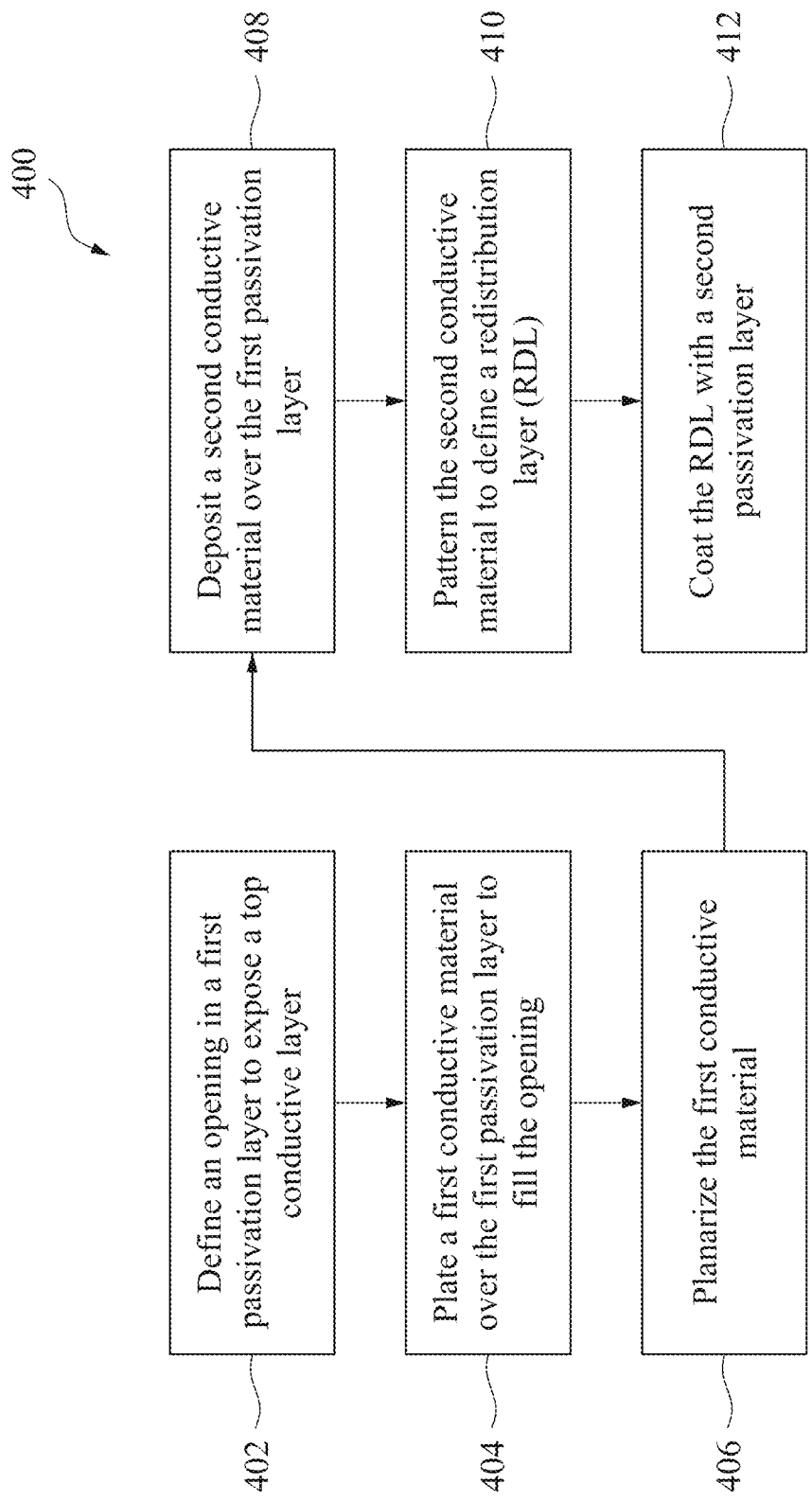
FIG. 4 is a flow chart of a method of making a semiconductor device according to some embodiments.

FIG. 4 is a flow chart of a method 400 of making a semiconductor device in accordance with some embodiments. In some embodiments, method 400 is used to form semiconductor device 100 (FIG. 1), semiconductor device 200 (FIG. 2A); semiconductor device 200' (FIG. 2B), or semiconductor device 300 (FIG. 3). In operation 402, an opening is defined in a first passivation layer to expose a top conductive layer. In some embodiments, top conductive layer is called top metal layer. The opening in the first passivation layer is formed by an etching process. In some embodiments, an etch stop layer is between the first passivation layer and the top conductive layer. In some embodiments, the etching process includes a multiple-step etching process. In some embodiments, the etching process forms tapered sidewalls of the opening. In some embodiments, the sidewalls of the opening are substantially perpendicular to a top surface of the top conductive layer. In some embodiments, a thickness of the first passivation layer ranges from about 300 nm to about 1900 nm. In some embodiments, the thickness of the first passivation layer ranges from about 500 nm to about 1500 nm. The thickness of the first passivation layer at this stage is larger than the thickness of first passivation layer 104 (FIG. 1) because a later planarization process will reduce the thickness of the first passivation layer to match that of first passivation layer 104.

In operation 404, a first conductive material is plated over the first passivation layer and fills the opening. The first conductive material completely fills the opening and extends along a top surface of the first passivation layer. In some embodiments, the first conductive material includes copper or copper alloys. In some embodiments, the plating process includes electro-chemical plating (ECP). In some embodiments, a thickness of the first conductive material ranges from about 450 nm to about 2150 nm. In some embodiments, the thickness of the first conductive material ranges from about 600 nm to about 1600 nm. If the thickness of the first conductive material is too small, the first conductive material does not completely fill the opening in the first passivation layer, in some instances. If the thickness of the first conductive material is too large, material is needlessly wasted and production costs increase, in some instances.

In operation 406, the first conductive material is planarized. The first conductive material is planarized so that a top surface of the planarized first conductive material is co-planar with a top surface of the planarized first passivation layer. The planarization process removes a portion of the first passivation layer and reduces a height of the first conductive material in the opening. In some embodiments, a thickness of the planarized first passivation layer ranges from about 200 nm to about 1800 nm. In some embodiments, the thickness of the planarized first passivation layer ranges from about 400 nm to about 1200 nm. In some embodiments, a thickness of the planarized first conductive material ranges from about 200 nm to about 1800 nm. In some embodiments, the thickness of the planarized first conductive ranges from about 400 nm to about 1200 nm. In some embodiments, the planarization process is a chemical-mechanical planarization (CMP) process. In some embodiments, the planarization process is an etching process. In some embodiments, the planarization process is a combination of a CMP process and an etching process.

In operation 408, a second conductive material is deposited over the first passivation layer. The second conductive material is electrically connected to the first conductive material. A bottom surface of the second conductive material is co-planar with a top surface of the first passivation layer because of the planarization process in operation 406. In some embodiments, the second conductive material extends along an entirety of the first passivation layer. The second conductive material is different from the first conductive material. In some embodiments, the second conductive material includes aluminum. In some embodiments, the second conductive material includes tungsten, gold or another suitable material. The deposition process is different from the plating process of operation 404. In some embodiments, the second conductive material is deposited using a sputtering process. In some embodiments, the second conductive material is deposited using PVD, CVD or another suitable deposition process. In some embodiments, a thickness of the second conductive material ranges from about 700 nm to about 4200 nm. In some embodiments, the thickness of the second conductive material ranges from about 1000 nm to about 3600 nm. A top surface of the second conductive material over the first conductive material is substantially flat.

In operation 410, the second conductive material is patterned to define an RDL. The second conductive material is patterned using an etching process. A photoresist material is deposited over the second conductive material and then the photoresist is patterned to define the shape of the RDL. The second conductive material is then etched to transfer the pattern of the photoresist to the second conductive material. The patterned second conductive material extends beyond the first conductive material on at least one side of the first conductive material. In some embodiments, the patterned second conductive material extends beyond the first conductive material on both sides of the first conductive material. In some embodiments, an edge of the patterned second conductive material is aligned with an edge of the first conductive material.

In operation 412, a second passivation layer is coated onto the RDL. The second passivation layer also coats the first passivation layer in areas of the first passivation layer exposed by the RDL. A top surface of the second passivation layer over the RDL is substantially flat. The second passivation layer over the first conductive material is free of voids. In some embodiments, the second passivation layer is formed by spin-on coating, PVD, CVD, sputtering or another suitable formation process.

In some embodiments, at least one operation of method 400 is removed. For example, in some embodiments, operation 410 is removed if the second conductive material is not blanket deposited onto the first passivation layer. In some embodiments, additional operations are added to method 400. For example, in some embodiments, method 400 includes operations for exposing a landing region of the RDL and forming a bump structure on the landing region. In some embodiments, an order of operations of method 400 is adjusted. For example, in some embodiments, the second passivation layer is coated on the second conductive material before the second conductive material is patterned, and then an additional coating of the second passivation layer is applied to cover sidewalls of the patterned second conductive material.

FIG. 5A is a cross-sectional view of a semiconductor device 500 following formation of an opening in a first passivation layer. Semiconductor device 500 is similar to semiconductor device 100 and includes some of the same elements. Same elements have a same reference number. An opening 550 is formed in first passivation layer 104. Opening 550 has tapered sidewalls. In some embodiments, opening 550 has sidewalls substantially perpendicular to a top surface of top metal layer 102.

FIG. 5B is a cross-sectional view of a semiconductor device 500' following plating of a first conductive material. Semiconductor device 500' is similar to semiconductor device 100 and includes some of the same elements. Same elements have a same reference number. The plated first conductive material includes RDL via 106 as well as first conductive material 560 extending along a top surface of first passivation layer 104.

FIG. 5C is a cross-sectional view of a semiconductor device 500" following planarization of the first conductive material. Semiconductor device 500" is similar to semiconductor device 100 and includes some of the same elements. Same elements have a same reference number. In comparison with semiconductor device 500', semiconductor device 500" does not include first conductive material 560 over first passivation layer 104. A thickness of first passivation layer 104 and a thickness of RDL via 106 in semiconductor device 500" is less than the thicknesses in semiconductor device 500' as a result of the planarization process, in some embodiments.

FIG. 5D is a cross-sectional view of a semiconductor device 500\* following deposition of a second conductive material. Semiconductor device 500\* is similar to semiconductor device 100 and includes some of the same elements. Same elements have a same reference number. The deposited second conductive material 570 extends along an entire top surface of first passivation layer 104 and electrically connects to RDL via 106.

FIG. 5E is a cross-sectional view of a semiconductor device 500^ during patterning of the second conductive material. Semiconductor device 500^ is similar to semiconductor device 100 and includes some of the same elements. Same elements have a same reference number. A photoresist 580 is formed over deposited second conductive material 570 and patterned to define a shape of an RDL.

FIG. 5F is a cross-sectional view of a semiconductor device 500 #following patterning of the second conductive material. Semiconductor device 500 #is similar to semiconductor device 100 and includes some of the same elements. Same elements have a same reference number. Deposited second conductive material 570 is patterned to form RDL 108. Photoresist 580 is also removed. In some embodiments, photoresist 580 is removed using an ashing process.

An aspect of this description relates to a method of making a semiconductor device. The method includes depositing a second conductive material over a first conductive material, wherein the second conductive material is different from the first conductive material, and the second conductive material defines a redistribution line (RDL). The method further includes depositing a passivation layer over the RDL, wherein depositing the passivation layer comprises forming a plurality of convex sidewalls, and each of the plurality of convex sidewalls extends beyond an edge of the RDL. In some embodiments, depositing the second conductive material includes depositing aluminum. In some embodiments, the method further includes depositing the first conductive material over an interconnect structure. In some embodiments, depositing the first conductive material includes depositing a copper containing material. In some embodiments, the method further includes patterning the second conductive material to define the RDL. In some embodiments, depositing the passivation layer includes depositing the passivation layer to define a flat top surface of the passivation layer over the RDL. In some embodiments, depositing the passivation layer comprises depositing the passivation layer to a thickness ranging from about 200 nanometers (nm) to about 2,000 nm.

An aspect of this description relates to a method of making a semiconductor device. The method includes plating a first conductive material over an interconnect structure. The method further includes depositing a second conductive material over the first conductive material, wherein the second conductive material is different from the first conductive material. The method further includes patterning the second conductive material to define a redistribution line (RDL). The method further includes depositing a passivation layer over the patterned second conductive material, wherein a sidewall of the second passivation layer has a convex curved shape extending beyond an edge of the RDL, and a thickness of the second passivation layer above the patterned second conductive material is substantially uniform. In some embodiments, depositing the second conductive material includes depositing aluminum. In some embodiments, plating the first conductive material includes plating a copper containing material. In some embodiments, the method further includes depositing an oxidation prevention layer over the interconnect structure. In some embodiments, the method further includes patterning the oxidation prevention layer to define an opening, wherein plating the first conductive material includes plating the first conductive material in the opening. In some embodiments, depositing the passivation layer includes depositing a same material as the oxidation prevention layer. In some embodiments, depositing the passivation layer includes depositing a different material from the oxidation prevention layer.

An aspect of this description relates to a semiconductor device. The semiconductor device includes a first conductive element electrically connect to an interconnect structure, wherein the first conductive element includes a first conductive material. The semiconductor device further includes an RDL over the first conductive element and electrically connected to the first conductive element, wherein the RDL includes a second conductive material different from the first conductive material. The semiconductor device further includes a passivation layer over the RDL, wherein a top portion of a sidewall of the second passivation layer includes a convex curve protruding in a direction parallel to a top surface of the interconnect structure, a width of the top portion at a bottom of the convex curve is less than a width of the top portion at a middle of the convex curve, and the middle of the convex curve is above the bottom of the convex curve. In some embodiments, the first conductive element includes copper. In some embodiments, the RDL comprises aluminum. In some embodiments, an entirety of the passivation layer over a top surface of the RDL via has a planar surface. In some embodiments, the semiconductor device further includes an oxidation prevention layer over the interconnect structure, wherein the oxidation prevention layer defines an opening. In some embodiments, the first conductive element is in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, the method comprising:

depositing a second conductive material over a first conductive material, wherein the second conductive material is different from the first conductive material, and the second conductive material defines a redistribution line (RDL); and depositing a passivation layer over the RDL, wherein depositing the passivation layer comprises forming a plurality of convex sidewalls, and each of the plurality of convex sidewalls extends beyond an edge of the RDL.

2. The method of claim 1, wherein depositing the second conductive material comprises depositing aluminum.

3. The method of claim 1, further comprising depositing the first conductive material over an interconnect structure.

4. The method of claim 3, wherein depositing the first conductive material comprises depositing a copper containing material.

5. The method of claim 1, further comprising patterning the second conductive material to define the RDL.

6. The method of claim 1, wherein depositing the passivation layer comprises depositing the passivation layer to define a flat top surface of the passivation layer over the RDL.

7. The method of claim 1, wherein depositing the passivation layer comprises depositing the passivation layer to a thickness ranging from about 200 nanometers (nm) to about 2,000 nm.

8. A method of making a semiconductor device, the method comprising:

plating a first conductive material over an interconnect structure;

depositing a second conductive material over the first conductive material, wherein the second conductive material is different from the first conductive material;

patterning the second conductive material to define a redistribution line (RDL); and depositing a passivation layer over the patterned second conductive material, wherein a sidewall of the passivation layer has a convex curved shape extending beyond an edge of the RDL, and a thickness of the second passivation layer above the patterned second conductive material is substantially uniform.

9. The method of claim 8, wherein depositing the second conductive material comprises depositing aluminum.

10. The method of claim 9, wherein plating the first conductive material comprises plating a copper containing material.

11. The method of claim 8, further comprising depositing an oxidation prevention layer over the interconnect structure.

12. The method of claim 11, further comprising patterning the oxidation prevention layer to define an opening, wherein plating the first conductive material comprises plating the first conductive material in the opening.

13. The method of claim 11, wherein depositing the passivation layer comprises depositing a same material as the oxidation prevention layer.

14. The method of claim 11, wherein depositing the passivation layer comprises depositing a different material from the oxidation prevention layer.

15. A method of making a semiconductor device, the method comprising:

forming a plurality of vias electrically connected to an interconnect structure, wherein each of the plurality of vias comprises a first conductive material;

depositing a continuous second conductive material over each of the plurality of vias, wherein the second conductive material is different from the first conductive material, and the continuous second conductive material defines a redistribution line (RDL); and depositing a passivation layer over the RDL, wherein depositing the passivation layer comprises forming a plurality of convex sidewalls, and each of the plurality of convex sidewalls extends beyond an edge of the RDL.

16. The method of claim 15, wherein forming the plurality of vias comprises:

forming a first via of the plurality of vias electrically connected to a first portion of the interconnect structure; and forming a second via of the plurality of vias electrically connected to a second portion of the interconnect structure, wherein a dielectric material is between the first portion of the interconnect structure and the second portion of the interconnect structure.

17. The method of claim 16, wherein depositing the continuous second conductive material comprises electrically connecting the first portion of the interconnect structure with the second portion of the interconnect structure through the RDL.

18. The method of claim 15, wherein forming the plurality of vias comprises forming the plurality of vias comprising copper.

19. The method of claim 15, wherein depositing the continuous second conductive material comprises depositing aluminum.

20. The method of claim 15, wherein depositing the continuous second conductive material comprises depositing the continuous second conductive material extending beyond the plurality of vias in a direction parallel to a top surface of the interconnect structure.

* * * * *